(12) United States Patent
Akita et al.

(10) Patent No.: US 11,990,886 B2
(45) Date of Patent: May 21, 2024

(54) FILTER UNIT

(71) Applicant: KABUSHIKI KAISHA TOYOTA JIDOSHOKKI, Kariya (JP)

(72) Inventors: Yoshifumi Akita, Kariya (JP); Tomohiro Suguro, Kariya (JP)

(73) Assignee: KABUSHIKI KAISHA TOYOTA JIDOSHOKKI, Kariya (JP)

( * ) Notice: Subject to any disclaimer, the term of this patent is extended or adjusted under 35 U.S.C. 154(b) by 85 days.

(21) Appl. No.: 17/597,014

(22) PCT Filed: Jun. 11, 2020

(86) PCT No.: PCT/JP2020/022982
§ 371 (c)(1),
(2) Date: Dec. 22, 2021

(87) PCT Pub. No.: WO2020/262013
PCT Pub. Date: Dec. 30, 2020

(65) Prior Publication Data
US 2022/0321084 A1    Oct. 6, 2022

(30) Foreign Application Priority Data

Jun. 27, 2019  (JP) .................................. 2019-120321

(51) Int. Cl.
*H03H 7/01* (2006.01)
*H01F 27/24* (2006.01)
*H01F 27/28* (2006.01)
*H01F 27/40* (2006.01)

(52) U.S. Cl.
CPC ........... *H03H 7/0115* (2013.01); *H01F 27/24* (2013.01); *H01F 27/2823* (2013.01); *H01F 27/40* (2013.01)

(58) Field of Classification Search
CPC ..... H03H 1/0007; H03H 7/0115; H01F 27/24
USPC .................................................. 333/175, 185
See application file for complete search history.

(56) References Cited

U.S. PATENT DOCUMENTS 6,438,000 B1 *  8/2002  Okamoto ................ H02M 1/12
                                                      363/40

FOREIGN PATENT DOCUMENTS

| JP | 03-51518 U    | 5/1991 |
| JP | 2015-167154 A | 9/2015 |
| JP | 2016-100348 A | 5/2016 |

OTHER PUBLICATIONS

International Search Report for PCT/JP2020/022982 dated Sep. 1, 2020 (PCT/ISA/210).

* cited by examiner

*Primary Examiner* — Rakesh B Patel
(74) *Attorney, Agent, or Firm* — Sughrue Mion, PLLC (57) ABSTRACT

A filter unit according to the present invention includes a substrate, capacitors mounted on the substrate, and two inductors. The inductors each include a wire and a core. The core includes two core bodies. The core bodies each have a ring shape and include a wiring hole. The capacitors are disposed between the two core bodies. An opposed section extends from the respective two core bodies to a position opposed to the capacitors C. The opposed section is opposed to all of the plurality of capacitors.

3 Claims, 6 Drawing Sheets

FILTER UNIT

CROSS REFERENCE TO RELATED APPLICATIONS

This application is a National Stage of International Application No. PCT/JP2020/022982 filed Jun. 11, 2020, claiming priority based on Japanese Patent Application No. 2019-120321 filed Jun. 27, 2019.

TECHNICAL FIELD

The present invention relates to a filter unit.

BACKGROUND ART

An electronic device includes a filter for attenuating noise. The filter described in Patent Document 1 includes an inductor and a capacitor. The inductor includes a wire and a core surrounding the wire.

PRIOR ART DOCUMENTS

Patent Documents

Patent Document 1: Japanese Laid-Open Patent Publication No. 2015-167154

SUMMARY OF THE INVENTION

Problems that the Invention is to Solve

When miniaturizing the filter, the capacitor is disposed near the core. When current flows through the wire, noise generates a magnetic field at the core. The magnetic field may affect the capacitor and lower the attenuation performance of the filter.

It is an objective of the present invention to provide a filter unit that avoids situations in which the noise attenuation performance is lowered.

Means for Solving the Problems

According to a first aspect of the present invention, a filter unit includes a capacitor and an inductor that includes a wire and a core. The core includes a looped core body into which the wire is inserted, and an opposed portion extending from the core body to a location that is opposed to the capacitor.

MODES FOR CARRYING OUT THE INVENTION

A filter unit according to one embodiment will now be described.

Figure 1:
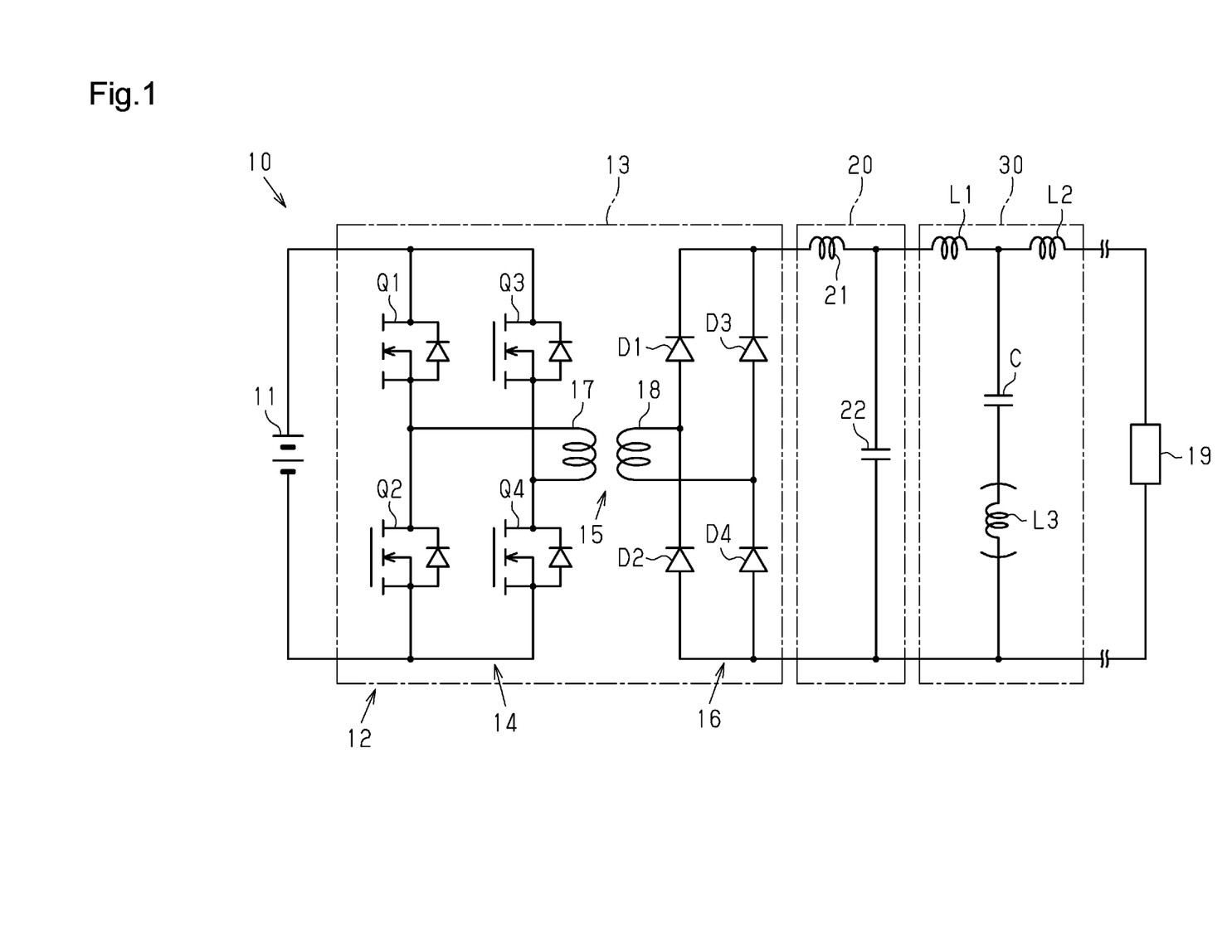
FIG. 1 is a schematic diagram of a power converter installed in a vehicle.

As shown in FIG. 1, a vehicle 10 includes a battery 11 and a power converter 12. The power converter 12 includes a DC/DC converter 13, a filter 20, and a filter unit 30. The vehicle 10 uses an electric motor as a drive source and is a battery electric vehicle or a hybrid electric vehicle. The battery 11 is used as a power source for the electric motor installed in the vehicle 10. The battery 11 is, for example, an electric storage device that can be charged and discharged such as a lithium-ion rechargeable battery or a nickel-hydrogen storage battery. The power converter 12 is electrically connected to a household load 19. The power converter 12 supplies the household load 19 with power.

The DC/DC converter 13 includes a bridge circuit 14, a transformer 15, and a rectifier circuit 16. The bridge circuit 14 is arranged at the primary side of the transformer 15 and includes four switching elements Q1 to Q4. The switching elements Q1, Q2 are connected in series. The switching elements Q3, Q4 are connected in series.

The rectifier circuit 16 is arranged at the secondary side of the transformer 15 and includes four diodes D1 to D4. The diodes D1, D2 are connected in series. The diodes D3, D4 are connected in series.

The transformer 15 includes a primary side winding 17 and a secondary side winding 18. The primary side winding 17 is connected to a connection node of the switching elements Q1, Q2 and a connection node of the switching elements Q3, Q4. The secondary side winding 18 is connected to a connection node of the diodes D1, D2 and a connection node of the diodes D3, D4.

The DC/DC converter 13 decreases the voltage of direct-current power from the battery 11 through switching actions of the switching elements Q1 to Q4. In the present embodiment, the switching elements Q1 to Q4 have switching frequencies of 150 kHz to 200 kHz. The DC/DC converter 13 outputs the decreased direct-current power to the filter 20. In the present embodiment, the DC/DC converter 13 is of a full-bridge type but may be of any type of DC/DC converter such as a half-bridge type.

The filter 20 includes a smoothing choke 21 and a smoothing capacitor 22. The filter 20 is an LC filter formed by the smoothing choke 21 and the smoothing capacitor 22. The filter 20 attenuates noise in a desired frequency band. The smoothing choke 21 smoothens output power including ripples rectified by the rectifier circuit 16.

Figure 2:
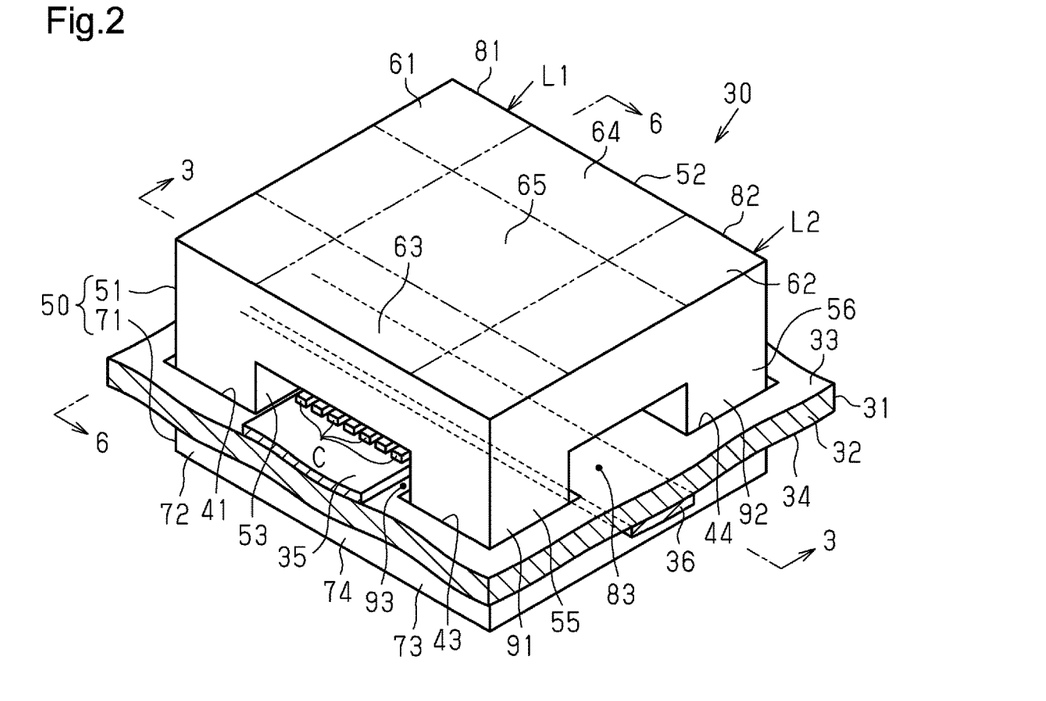
FIG. 2 is a perspective view of a filter unit.

As shown in FIGS. 1 and 2, the filter unit 30 includes a substrate 31, a capacitor mounted on the substrate 31, and two inductors L1, L2 mounted on the substrate 31. The DC/DC converter 13 and the filter 20 are also mounted on the substrate 31 (not shown).

Figure 3:
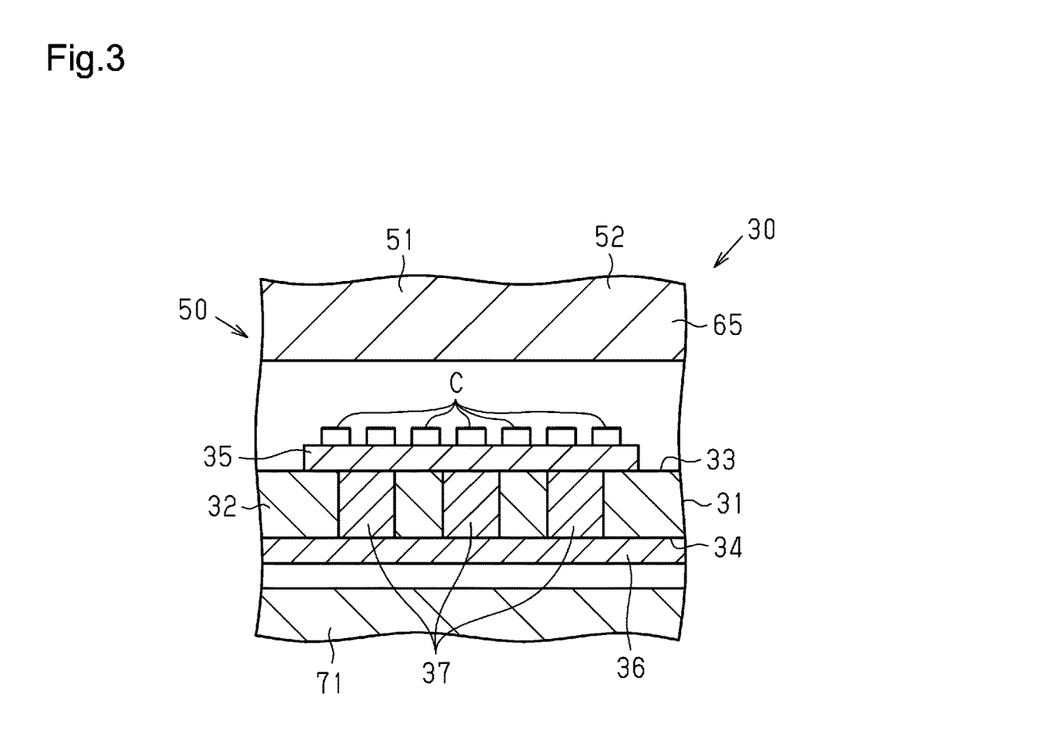
FIG. 3 is a cross-sectional view taken along line 3-3 in FIG. 2.

As shown in FIGS. 2 and 3, the inductors L1, L2 each include a wire 36, which serves as a power line, and a core 50. The substrate 31 includes an insulation layer 32, a pattern 35 to which capacitors C are connected, and vias 37 that connect the pattern 35 to the wire 36. One of the two surfaces of the insulation layer 32 in the thickness direction defines a first surface 33 and the other defines a second surface 34. The pattern 35 is arranged on the first surface 33. The wire 36 is arranged on the second surface 34. The pattern 35 intersects the wire 36 as viewed in the thickness direction of the substrate 31. Copper foil, for example, is used as the pattern 35. A bus bar is used as the wire 36. The capacitors C are connected to the pattern 35 with a joining material such as solder.

Figure 4:
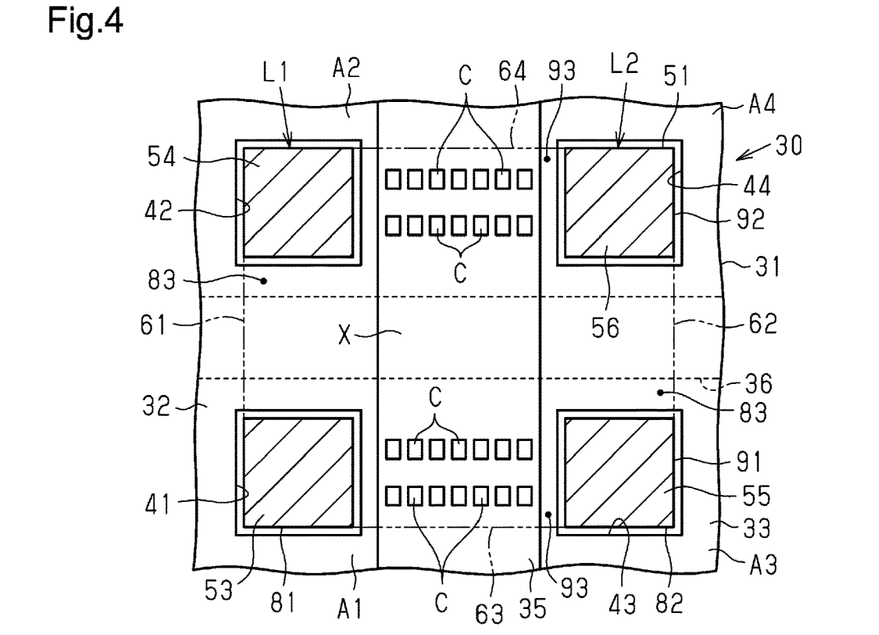
FIG. 4 is a cross-sectional view illustrating part of the filter unit.

As shown in FIG. 4, the insulation layer 32 includes four holes 41 to 44 extending through the substrate 31 in the thickness direction. The substrate 31 includes an intersection X where the pattern 35 intersects the wire 36 as viewed in the thickness direction of the substrate 31. When the insulation layer 32 is viewed in the thickness direction of the substrate 31, the pattern 35 and the wire 36 divide the area around the intersection X into four fields A1, A2, A3, A4. The four fields A1 to A4 each include one of the holes 41 to 44. The four holes 41 to 44 are arranged at opposite sides of the pattern 35 and opposite sides of the wire 36. In the following description, the first hole 41 is one of the four holes 41 to 44. The second hole 42 is arranged such that the wire 36 is arranged between the second hole 42 and the first hole 41. A third hole 43 is arranged such that the pattern 35 is arranged between the third hole 43 and the first hole 41. A fourth hole 44 is arranged such that the wire 36 is arranged between the fourth hole 44 and the third hole 43. The distance between the center axis of the first hole 41 and the center axis of the second hole 42 is equal to the distance between the center axis of the third hole 43 and the center axis of the fourth hole 44. The distance between the center axis of the first hole 41 and the center axis of the third hole 43 is equal to the distance between the center axis of the second hole 42 and the center axis of the fourth hole 44.

The capacitors C are separated and arranged at two locations. The capacitors C are arranged between the first hole 41 and the third hole 43 and between the second hole 42 and the fourth hole 44. As shown in FIG. 4, multiple capacitors C are arranged on the pattern 35. FIG. 1 shows the combined capacitance of the capacitors C as a single capacitor C.

Figure 5:
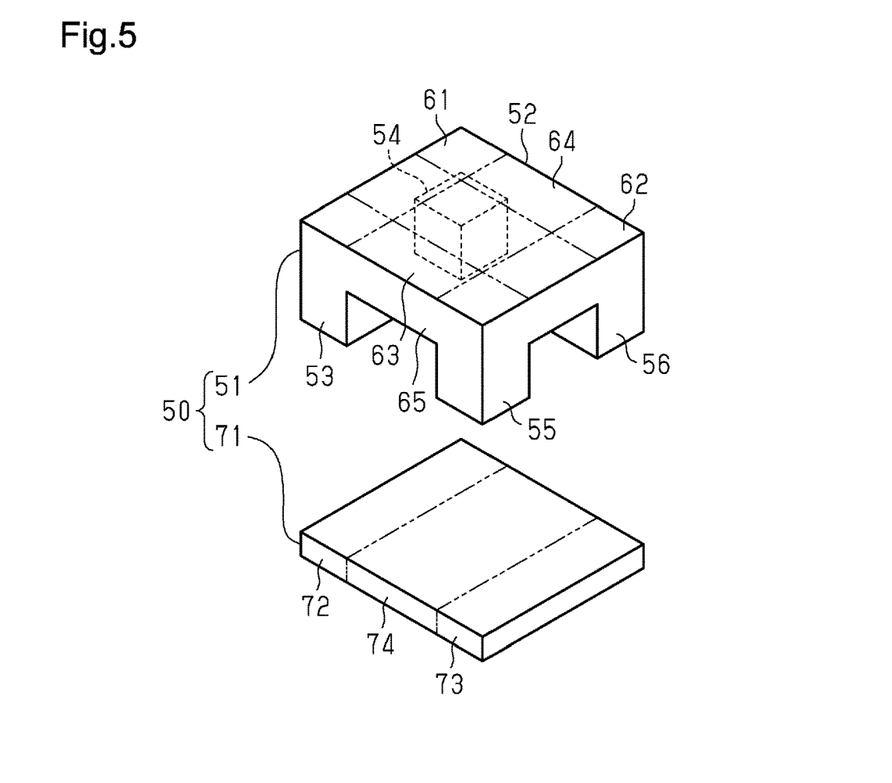
FIG. 5 is an exploded perspective view of a core.

As shown in FIG. 5, the core 50 is divided into two. The core 50 is a dust core formed by high-pressure molding metal magnetic powder together with a binder. The core 50 may be of any type such as a ferrite core. The core 50 includes a first core 51 and a second core 71. The first core 51 includes a rectangular flat base 52 and legs 53 to 56 arranged at the corners of the base 52. The legs 53 to 56 are pillar-shaped. The legs 53 to 56 extend in the thickness direction of the base 52. The legs 53 to 56 extend from the base 52 in the same direction. In the following description, the first leg 53 is one of the four legs 53 to 56. The second leg 54 is arranged next to the first leg 53 in the transverse direction of the base 52. The third leg 55 is arranged next to the first leg 53 in the longitudinal direction of the base 52. The fourth leg 56 is arranged next to the third leg 55 in the transverse direction of the base 52. The distance between the center axis of the first leg 53 and the center axis of the second leg 54 is equal to the distance between the center axis of the first hole 41 and the center axis of the second hole 42. The distance between the center axis of the first leg 53 and the center axis of the third leg 55 is equal to the distance between the center axis of the first hole 41 and the center axis of the third hole 43.

The base 52 includes a first connection portion 61 that connects the first leg 53 to the second leg 54 and a second connection portion 62 that connects the third leg 55 to the fourth leg 56. The first connection portion 61 includes a section of the base 52 that faces the first leg 53, a section of the base 52 that faces the second leg 54, and a section of the base 52 between the first leg 53 and the second leg 54. The second connection portion 62 includes a section of the base 52 that faces the third leg 55, a section of the base 52 that faces the fourth leg 56, and a section of the base 52 between the third leg 55 and the fourth leg 56.

The base 52 includes a third connection portion 63 that connects the first leg 53 to the third leg 55 and a fourth connection portion 64 that connects the second leg 54 to the fourth leg 56. The third connection portion 63 includes a section of the base 52 that faces the first leg 53, a section of the base 52 that faces the third leg 55, and a section between the first leg 53 and the third leg 55. The fourth connection portion 64 includes a section of the base 52 that faces the second leg 54, a section of the base 52 that faces the fourth leg 56, and a section between the second leg 54 and the fourth leg 56. The third connection portion 63 and the first connection portion 61 share the section of the base 52 that faces the first leg 53. The third connection portion 63 and the second connection portion 62 share the section of the base 52 that faces the third leg 55. The fourth connection portion 64 and the first connection portion 61 share the section of the base 52 that faces the second leg 54. The fourth connection portion 64 and the second connection portion 62 share the section of the base 52 that faces the fourth leg 56.

The base 52 includes an opposed portion 65 between the first connection portion 61 and the second connection portion 62. The opposed portion 65 connects the first connection portion 61 and the second connection portion 62. Parts of the opposed portion 65 form parts of the third connection portion 63 and the fourth connection portion 64.

The second core 71 is rectangular and flat. The second core 71 is sized to contact all of the four legs 53 to 56 of the first core 51 when the second core 71 is arranged under the first core 51. In the present embodiment, the surface of the second core 71 in the thickness direction has the same shape as the surface of the base 52 in the thickness direction.

Figure 6:
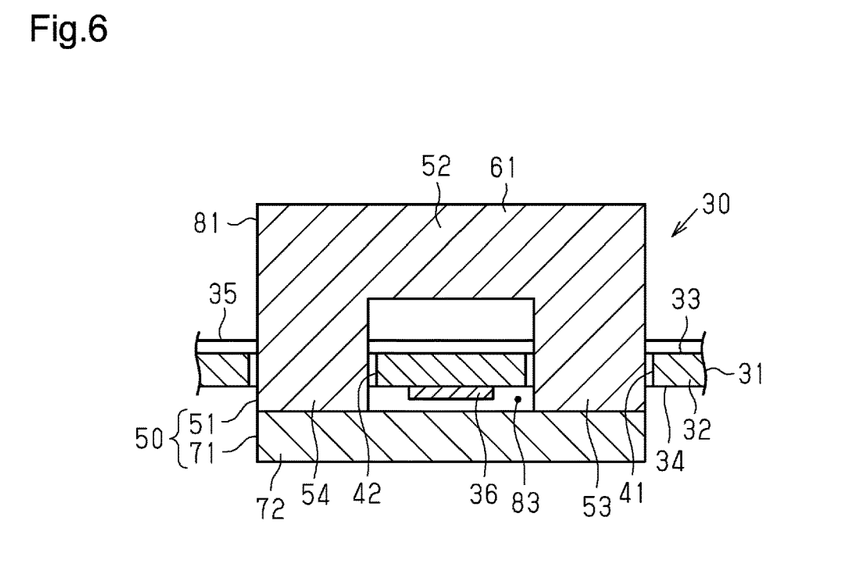
FIG. 6 is a cross-sectional view taken along line 6-6 in FIG. 2.

As shown in FIGS. 2, 4, and 6, the first core 51 and the second core 71 are arranged so that the substrate 31 is located between the base 52 and the second core 71. The first core 51 is arranged so that the base 52 is opposed to the first surface 33 of the substrate 31. The second core 71 is arranged opposed to the second surface 34 of the substrate 31. The legs 53 to 56 of the first core 51 are inserted into the corresponding holes 41 to 44. Specifically, the first leg 53 is inserted into the first hole 41, the second leg 54 is inserted into the second hole 42, the third leg 55 is inserted into the third hole 43, and the fourth leg 56 is inserted into the fourth hole 44. The legs 53 to 56 extend through the insulation layer 32. The legs 53 to 56 are in contact with the second core 71. Specifically, the legs 53 to 56 of the first core 51 are in contact with the four corners of the second core 71. The second core 71 is opposed to the first core 51 while the substrate 31 is located between the second core 71 and the first core 51.

As shown in FIGS. 2 and 6, when the legs 53 to 56 are in contact with the second core 71, the core 50 includes two core bodies 81, 82, which are formed by the base 52, the legs 53 to 56, and the second core 71. One core body 81 is formed by the first leg 53, the second leg 54, the first connection portion 61, and a first portion 72 of the second core 71. The first portion 72 is a section of the second core 71 that is opposed to the first connection portion 61 with the substrate 31, the first leg 53, and the second leg 54 located in between. The other core body 82 is formed by the third leg 55, the fourth leg 56, the second connection portion 62, and a second portion 73 of the second core 71. The second portion 73 is a section of the second core 71 that is opposed to the second connection portion 62 with the substrate 31, the third leg 55, and the fourth leg 56 located in between. The opposed portion 65 connects the core bodies 81, 82. The second core 71 includes a third portion 74 between the first portion 72 and the second portion 73. The third portion 74 connects the core bodies 81, 82.

In the present embodiment, the core bodies 81, 82 have the same shape. The core bodies 81, 82 are looped to include a wire hole 83. The wire 36 is inserted through the wire hole 83. The core bodies 81, 82 are arranged so that their center axes extend in the same direction. The same direction, as referred to here, allows for an error within a tolerance range.

The wire 36 extends straight through the wire holes 83 of the core bodies 81, 82. The core 50 acts on a magnetic field generated by the current flowing through the wire 36 and forms the inductors L1, L2. In the present embodiment, the inductors L1, L2 are formed by the wire 36 and the core bodies 81, 82. It can also be understood that the wire 36 and the core 50 form a single inductor.

The capacitors C are each located between the core bodies 81, 82. The capacitors C are located between the first leg 53 and the third leg 55 and between the second leg 54 and the fourth leg 56. The opposed portion 65 is opposed to the capacitors C in the thickness direction of the substrate 31. The thickness direction of the substrate 31 corresponds to the direction in which the pattern 35 is arranged on the insulation layer 32. The opposed portion 65 extends from the core bodies 81, 82 to a location that is opposed to the capacitors C. The opposed portion 65 is opposed to all of the capacitors C. The capacitors C are arranged between the opposed portion 65 and the substrate 31 in the thickness direction of the substrate 31.

The third portion 74 of the second core 71 extends from the core bodies 81, 82 to a location opposed to the capacitors C with the substrate 31 located in between. The third portion 74 of the second core 71 is opposed to all of the capacitors C with the substrate 31 located in between. The capacitors C are arranged between the opposed portion 65 and the third portion 74 in the thickness direction of the substrate 31.

As shown in FIGS. 2 and 4, the core 50 includes two looped portions 91, 92, which are formed by the base 52, the legs 53 to 56, and the second core 71. One looped portion 91 is formed by the first leg 53, the third leg 55, the third connection portion 63, and the second core 71. The other looped portion 92 is formed by the second leg 54, the fourth leg 56, the fourth connection portion 64, and the second core 71.

The looped portions 91, 92 each include a connection hole 93. The pattern 35 is inserted into the connection hole 93. The looped portions 91, 92 are arranged so that their center axes extend in the same direction. The same direction as referred to here allows for an error within a tolerance range. The direction in which the center axes of the looped portions 91, 92 extend is orthogonal to the direction in which the center axes of the core bodies 81, 82 extend. The core 50 includes the wire holes 83 into which the wire 36 for the inductors L1, L2 is inserted and the connection holes 93 into which the pattern 35 for connection of the capacitors C are inserted. Each of the wire holes 83 has a longitudinal dimension that is orthogonal to the center axis of the wire hole 83 and the thickness direction of the substrate 31. Each of the connection holes 93 has a longitudinal dimension that is orthogonal to the center axis of the connection hole 93 and the thickness direction of the substrate 31. The length of the wire hole 83 is less than the length of the connection hole 93.

The filter unit 30 attenuates noise included in direct-current power, which is output from the filter 20, and outputs the direct-current power. The filter unit 30 of the present embodiment attenuates noise in a frequency band that is lower than or equal to 150 kHz to 200 kHz, which corresponds to the switching frequencies of the switching elements Q1 to Q4, and in a frequency band higher than or equal to 500 kHz, which corresponds to frequencies used for AM broadcasting. The filter unit 30 outputs the power supplied to the household load 19.

The operation of the present embodiment will now be described.

The inductors L1, L2 are formed by the wire 36 and the looped core bodies 81, 82 surrounding the wire 36. The inductors L1, L2 have a higher impedance at higher frequencies. This removes noise at high frequencies.

Further, when noise current of a high frequency flows through the wire 36, a magnetic field corresponding to the noise current is generated in the core 50. The noise current is converted into the magnetic field and consumed as a magnetic loss. This reduces the noise current.

As shown in FIG. 1, the filter unit 30 includes an inductance component L3 formed as a result of the capacitors C and the pattern 35. The effect of a magnetic field magnetically couples the inductors L1, L2 to the inductance component L3 and induces voltage. The effect of the voltage may lower the attenuation performance of the filter unit 30. The filter unit 30 of the present embodiment limits the effects of the magnetic field on the capacitors C to limit magnetic coupling of the inductors L1, L2 with the inductance component L3. A more specific description will now be given.

First, a filter unit according to a comparative example will be described. The filter unit of the comparative example has the same configuration as the filter unit of the present embodiment except in that the shape of the core differs from the present embodiment.

Figure 7:
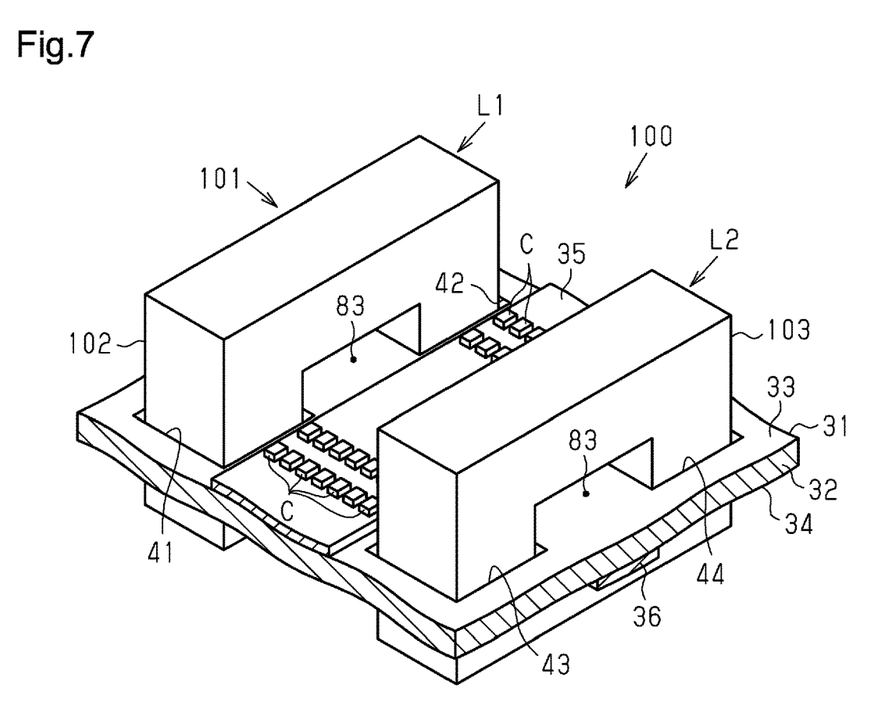
FIG. 7 is a perspective view of a filter unit in a comparative example.

As shown in FIG. 7, a filter unit 100 of the comparative example includes a core 101. The core 101 includes looped core bodies 102, 103. The core 101 does not include a portion opposed to the capacitors C in the thickness direction of the substrate 31. That is, the core 101 used in the filter unit 100 of the comparative example does not include the opposed portion 65 of the core 50 of the present embodiment.

Figure 8:
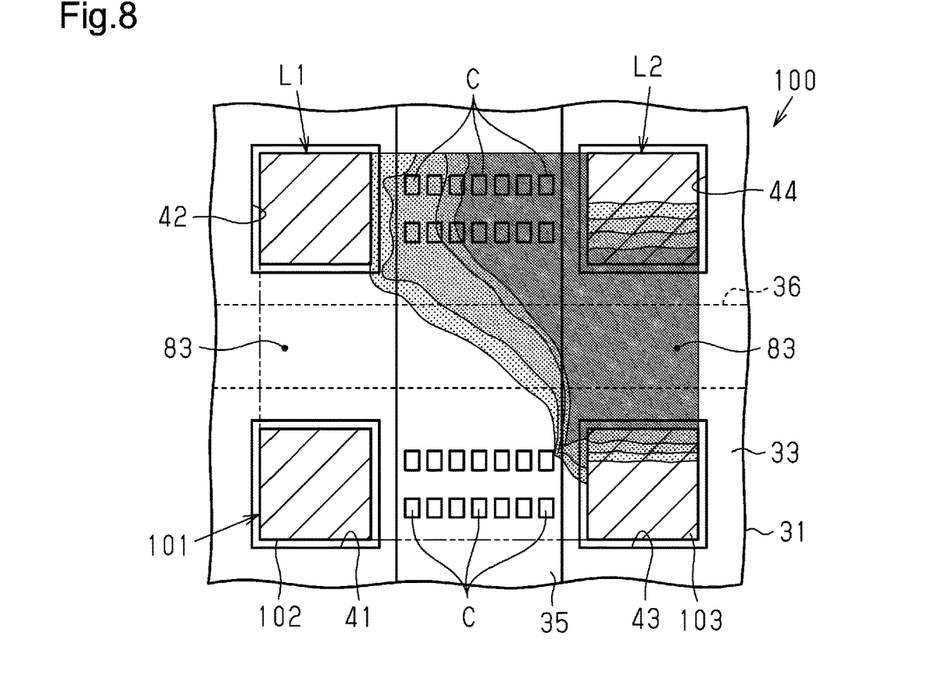
FIG. 8 is a schematic diagram illustrating a simulation result of a magnetic field distribution in the filter unit in the comparative example.

FIG. 8 shows the magnetic field distribution inside the core 101 of the filter unit 100 of the comparative example when current flows through the wire 36. The magnetic field distribution shows the intensity of the magnetic field, that is, the magnetic flux density. In FIG. 8, the intensity of the magnetic field is shaded so that the shading darkens as the intensity of the magnetic field increases. As can be understood from FIG. 8, in the filter unit 100 of the comparative example, the capacitors C are located where the intensity of the magnetic field is high. Thus, magnetic coupling easily occurs with the inductors L1, L2 and the inductance component L3.

Figure 9:
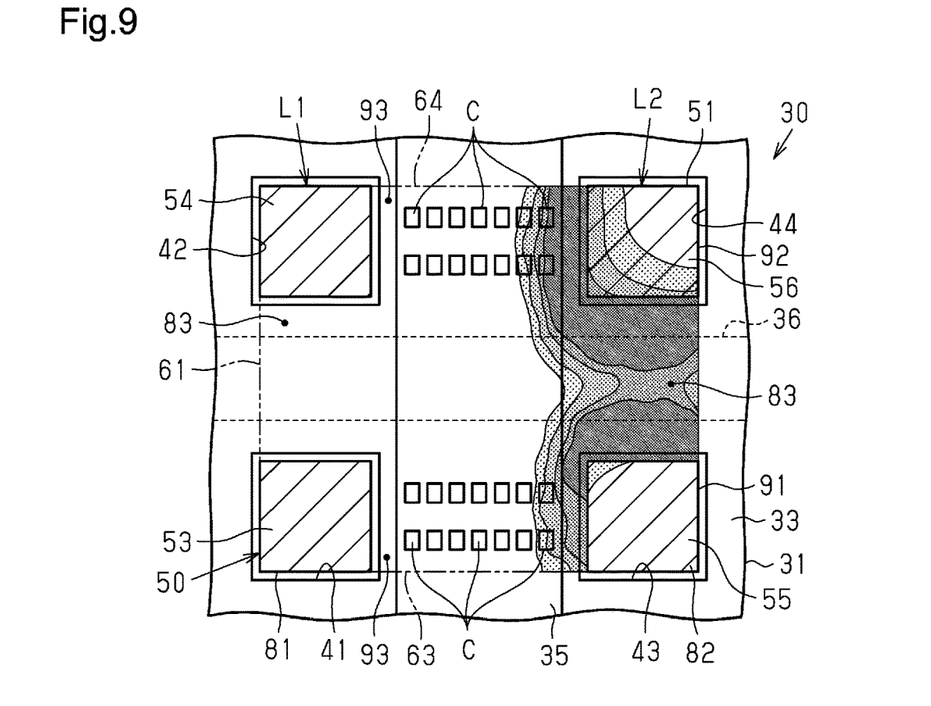
FIG. 9 is a schematic diagram illustrating a simulation result of a magnetic field distribution in the filter unit in an embodiment.

FIG. 9 shows the magnetic field distribution inside the core 50 of the filter unit 30 of the present embodiment when current flows through the wire 36. As can be understood from FIG. 9, the opposed portion 65 opposed to the capacitors C induces the magnetic field so that the intensity of the magnetic field is weaker at locations where the capacitors C are arranged compared to when there is no opposed portion 65.

Figure 10:
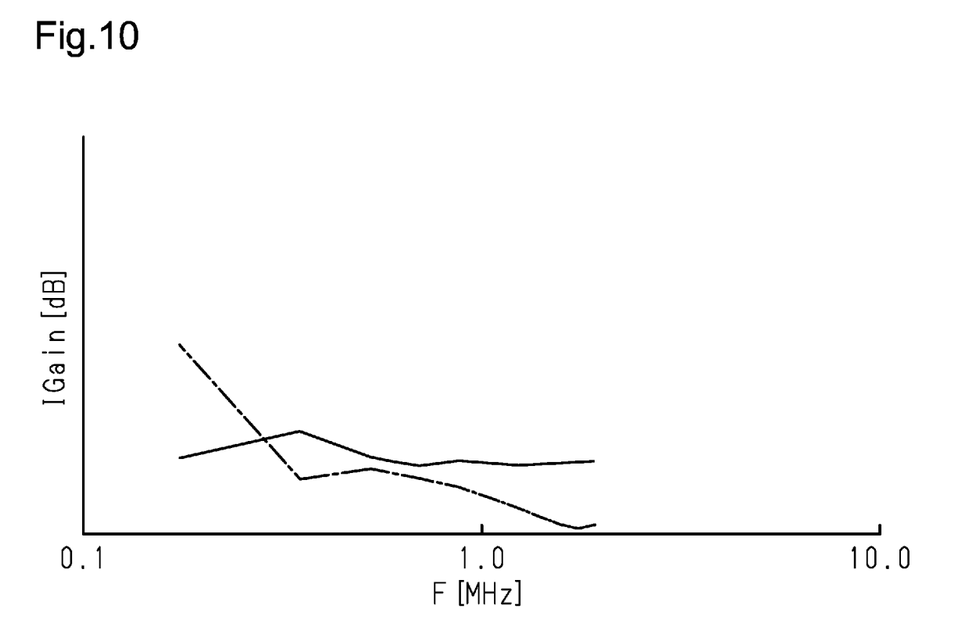
FIG. 10 is a diagram showing the attenuation performance of the filter unit in the embodiment and the attenuation performance of the filter unit in the comparative example.

FIG. 10 shows the attenuation performance of the filter units 30, 100 with the vertical axis representing gain, or attenuation rate, and the horizontal axis representing frequency. The long-dash short-dash line indicates the attenuation performance of the filter unit 100 of the comparative example, and the solid line indicates the attenuation performance of the filter unit 30 of the present embodiment. In the filter unit 100 of the comparative example, the attenuation performance becomes low from the range of 150 kHz to 200 kHz. In the filter unit 30 of the present embodiment, a decrease in the attenuation performance is suppressed in the bandwidth that is lower than or equal to 150 kHz to 200 kHz. In this manner, the opposed portion 65 induces the magnetic field so that the intensity of the magnetic field where the capacitors C are arranged is weakened. This suppresses a decrease in the attenuation performance.

When power output from the DC/DC converter 13 is supplied to the household load 19, the frequency band in which noise is attenuated may be required to become wider so that the noise included in the power output from the DC/DC converter 13 does not enter a house. The filter unit 30 of the present embodiment is required to attenuate noise in the frequency band lower than or equal to the switching frequencies and the frequency band higher than or equal to frequencies used for AM broadcasting. To attenuate noise in a wider frequency band, the quantity of the filters or the quantity of the capacitors C may be increased. However, when the quantity of the filters or the quantity of the capacitors C is increased, the power converter 12 will be enlarged. In contrast, the present embodiment improves the noise attenuation performance by changing the magnetic field distribution. This improves the attenuation performance of the filter unit 30 while avoiding enlargement of the power converter 12 as compared with when the quantity of the filters or the quantity of the capacitors C is increased.

The advantages of the present embodiment will now be described.

(1) The core 50 includes the opposed portion 65, which is opposed to the capacitors C. The opposed portion 65 induces a magnetic field so that the intensity of the magnetic field where the capacitors C are arranged is weakened as compared with when there is not opposed portion 65. This limits the effects of the magnetic field on the capacitors C and suppresses a decrease in the attenuation performance of the filter unit 30.

(2) The pattern 35 intersects the wire 36 as viewed in the thickness direction of the substrate 31. The pattern 35 is arranged over the wire 36 as viewed in the thickness direction of the substrate 31, thereby downsizing the filter unit 30.

(3) The two core bodies 81, 82 are laid out with the capacitors C arranged between the core bodies 81, 82. With this layout, the space between the two core bodies 81, 82 is used for the arrangement of the capacitors C. This downsizes the filter unit 30 as compared with when the capacitors C are arranged in a location differing from the space between the two core bodies 81, 82.

(4) The opposed portion 65 connects the core bodies 81, 82. The opposed portion 65, which connects the core bodies 81, 82, easily induces the magnetic field so that the intensity of the magnetic field is weakened where the capacitors C are arranged.

(5) The filter unit 30 is an output filter arranged on the secondary side of the transformer 15. The DC/DC converter 13 decreases voltage. Thus, the current flowing at the secondary side of the transformer 15 is greater than the current flowing at the primary side of the transformer 15. When the current is large, noise is difficult to attenuate. The present embodiment suppresses a decrease in the attenuation performance of the filter unit 30. Thus, noise is attenuated efficiently even when the current is large.

The present embodiment may be modified as described below. The present embodiment and the following modifications can be combined as long as the combined modifications remain technically consistent with each other.

The opposed portion 65 does not need to connect the core bodies 81, 82. In this case, the opposed portion 65 is arranged on one of the core bodies 81, 82.

The core 50 only needs to include one of the core bodies 81, 82. In this case, the capacitors C may be arranged anywhere near the core body 81 or 82.

The shape of the opposed portion 65 may be modified. The opposed portion 65 only needs to be opposed to at least the capacitors C and does not need to include a section that is not opposed to the capacitors C. When the shape of the opposed portion 65 is modified, the shape of the second core 71 may be modified in accordance with the shape of the opposed portion 65. Preferably, the second core 71 is arranged at a location that is opposed to the opposed portion 65 with the substrate 31 arranged between the first core 51 and the second core 71.

The pattern 35 does not need to intersect the wire 36 as viewed in the thickness direction of the substrate 31.

The opposed portion 65 may be opposed to the capacitors C in a direction that is orthogonal to the thickness direction of the substrate 31 and to the direction in which the center axes of the core bodies 81, 82 extend. In other words, the opposed portion 65 may extend from the core bodies 81, 82 to a location that is opposed to the capacitors C. The opposed portion 65 may be opposed to the capacitors C in any direction.

The opposed portion 65 may be opposed to at least some of the capacitors C.

The core 50 does not need to be divided into the first core 51 and the second core 71.

The wire 36 may be wound around the core bodies 81, 82.

The filter unit 30 may be used to attenuate noise in alternating-current power.

The filter unit 30 may be arranged in any device as long as the device noise needs to be attenuated.

The invention claimed is:

1. A filter unit, comprising:
a capacitor;
an inductor that includes a wire and a core; and
a substrate on which the capacitor is mounted, wherein the core includes
a looped core body into which the wire is inserted, and
an opposed portion extending from the looped core body in a width direction of the substrate, to a location that is opposed to the capacitor, so that the opposed portion faces the capacitor in a thickness direction of the substrate,
the substrate includes a pattern to which the capacitor is connected, and
the pattern intersects the wire as viewed in the thickness direction of the substrate, wherein
the looped core body is one of two looped core bodies, and
the capacitor is arranged between the two looped core bodies so as to be outside of each of the two looped core bodies.

2. The filter unit according to claim 1, wherein the opposed portion connects the two looped core bodies.

3. A filter unit, comprising:
a capacitor;
an inductor that includes a wire and a core; and a substrate on which the capacitor is mounted, wherein the core includes a looped core body into which the wire is inserted, and an opposed portion extending from the looped core body in a width direction of the substrate, to a location that is opposed to the capacitor, so that the opposed portion faces the capacitor in a thickness direction of the substrate, the substrate includes a pattern to which the capacitor is connected, and the pattern intersects the wire as viewed in the thickness direction of the substrate, wherein the capacitor is located outside of the looped core body.

\* \* \* \* \*